United States Patent
Gill et al.

(10) Patent No.: US 10,848,134 B2
(45) Date of Patent: Nov. 24, 2020

(54) LATCH WITH REDUNDANCY AND CIRCUITRY TO PROTECT AGAINST A SOFT ERROR

(71) Applicant: Intel Corporation, Santa Clara, CA (US)

(72) Inventors: Balkaran Gill, Cornelius, OR (US); Norbert R. Seifert, Beaverton, OR (US); Shah M. Jahinuzzaman, Portland, OR (US); Randy L. Allmon, North Grafton, MA (US)

(73) Assignee: Intel Corporation, Santa Clara, CA (US)

( * ) Notice: Subject to any disclaimer, the term of this patent is extended or adjusted under 35 U.S.C. 154(b) by 1130 days.

(21) Appl. No.: 14/866,469

(22) Filed: Sep. 25, 2015

(65) Prior Publication Data

US 2017/0093380 A1 Mar. 30, 2017

(51) Int. Cl.
*H03K 3/356* (2006.01)
*H03K 3/037* (2006.01)

(52) U.S. Cl.
CPC ..... *H03K 3/356104* (2013.01); *H03K 3/0375* (2013.01)

(58) Field of Classification Search
CPC .... H03K 3/013; H03K 3/0372; H03K 3/0375; H03K 3/356104; H03K 3/356113; H03K 3/356147; H03K 3/356156; H03K 3/356182; H03K 3/356191; H03K 3/3562; H03K 3/35625; H03K 19/003; H03K 19/00315; H03K 19/0033; H03K 19/00338; H03K 19/00361; H03K 19/00392; H03K 19/0075

See application file for complete search history.

(56) References Cited

U.S. PATENT DOCUMENTS

| | | | |
|---|---|---|---|
| 6,696,874 B2* | 2/2004 | Wood | H03K 3/0375 327/208 |
| 7,518,427 B2 | 4/2009 | Gill et al. | |
| 7,649,396 B2 | 1/2010 | Gill et al. | |
| 7,982,515 B2* | 7/2011 | Nakamura | H03K 3/0375 327/208 |
| 8,278,692 B2 | 10/2012 | Ambrose et al. | |
| 2007/0133261 A1 | 6/2007 | Tsuruta et al. | |
| 2009/0085627 A1 | 4/2009 | Gill et al. | |
| 2009/0219752 A1* | 9/2009 | Wissel | G11C 11/4125 365/154 |
| 2009/0249141 A1 | 10/2009 | Yasuda | |
| 2010/0039135 A1 | 2/2010 | Miyazaki | |

(Continued)

FOREIGN PATENT DOCUMENTS

JP 2013-143666 A 7/2013

OTHER PUBLICATIONS

PCT International Search Report and Written Opinion for Counterpart PCT International Application No. PCT/US2016/042999, dated Oct. 25, 2016, 14 pages.

(Continued)

*Primary Examiner* — Patrick O Neill
(74) *Attorney, Agent, or Firm* — Compass IP Law PC

(57) ABSTRACT

An apparatus is described having a latch circuit. The latch circuit includes redundant data inputs, redundant data outputs, redundant clock inputs and circuitry to self-correct a soft-error.

8 Claims, 6 Drawing Sheets

(56) References Cited

U.S. PATENT DOCUMENTS

2014/0340133 A1* 11/2014 Gasiot .................. H03L 7/0891
327/157

OTHER PUBLICATIONS

Chen, C.H., et al., Characterization of Heavy-Ion-Induced Single-Event Effects in 5nm Bulk CMOS ASIC Test Chips, IEEE Transactions on Nuclear Science, vol. 61 No. 5, Oct. 2014, 8 pages.
Extended European Search Report for Patent Application No.16849149.6, dated Apr. 4, 2019 ,11 pages.
Maru, A., et al., DICE-Based Flip-Flop With SET Pulse Discriminator on a 90 nm Bulk CMOS Process, IEEE Transactions on Nuclear Science, vol. 57, No. 6, Dec. 2010, 7 pages.
Wang, W.. et al., Edge Triggered Pulse Latch Design With Delayed Latching Edge for Radiation Hardened Application, IEEE Transactions on Nuclear Science, vol. 51, No. 6, Dec. 2004, 5 pages.
Zhang, M., et al., Sequential Element Design With Built-In Soft Error Resilience, IEEE Transactions on Very Large Scale Integration (VLSI) Systems, vol. 14, No. 12, Dec. 2006, 11 pages.

* cited by examiner

200

LATCH WITH REDUNDANCY AND CIRCUITRY TO PROTECT AGAINST A SOFT ERROR

FIELD OF INVENTION

The field of invention pertains generally to electronic circuitry and, more specifically, to a latch with redundancy and circuitry to protect against a soft error.

BACKGROUND

In the field of electronic circuitry, soft errors are becoming an increasingly problematic issue. Here, with device sizes shrinking and with corresponding reductions in supply voltages and/or logic voltage margins, the probability that a soft error will arise is steadily increasing. Increasing soft errors threaten the viability of a circuit's implementation since important data calculations may be made with the circuit and any error in the circuit's resultant data values are ultimately unacceptable.

FIGURES

A better understanding of the present invention can be obtained from the following detailed description in conjunction with the following drawings, in which:

FIG. 2b shows a flip-flop constructed from the latch circuit of FIG. 2a;

DETAILED DESCRIPTION

Figure 1:
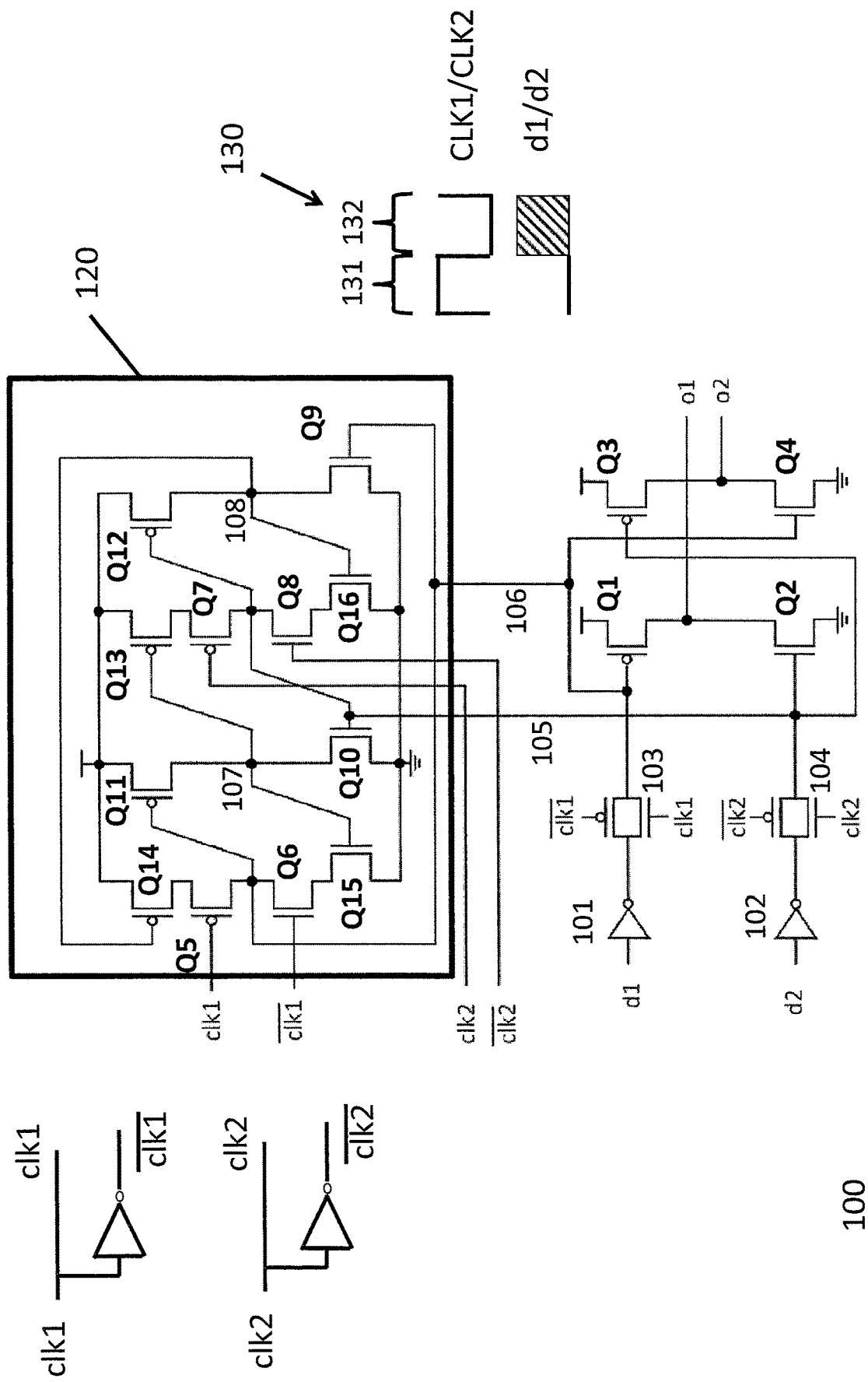
FIG. 1 shows a latch circuit having improved soft error suppression.

FIG. 1 shows a latch circuit 100 that employs redundancy along the data path in order to provide built-in protection against a soft-error, such as a particle hit or other corrupting event (e.g., an "inadvertent glitch"), should one occur along either one of the data paths. As observed in FIG. 1 the circuit includes a pair of data lines d1 and d2 which, in the particular embodiment of FIG. 1, are not logical complements of one another (they carry the same logical signal). Redundant clock signals CLK1 and CLK2 are also provided to the latch circuit. In an embodiment, both clock lines carry the same clock signal. As such, the latch circuit is also protected against a soft error on either clock line. That is, should a soft error "glitch" occur on one of the data lines or one of the clock lines, the other redundant data line or clock line is sufficient for the latch to hold the correct data.

Inset 130 of FIG. 1 shows an embodiment of the signaling when a logical "0" is to be latched into the circuit. According to nominal operation, the new data is initially entered into the latch circuit when both clock signals CLK1, CLK2 are a logic high. Here, at time 131, both clock signals CLK1, CLK2 are a logical high and both data inputs d1, d2 are a logical low. Inverters 101, 102 invert the received low d1, d2 input signals and present logic high signals to switches 103, 104. Because both clock signals CLK1, CLK2 are a logic high in time 131, both of switches 103, 104 are in pass mode and a pair of logic high signals are passed to internal nodes 105, 106 respectively.

With both of internal nodes 105, 106 at a logic high level, PMOS transistor Q1 will be "off" and NMOS transistor Q2 will be "on" which sets output O1 to a logical low (Q2 pulls O1 to ground). Similarly, PMOS transistor Q3 will be "off" and NMOS transistor Q4 will be "on" setting output O2 to a logical low. Thus, the new data appears at the circuit outputs O1, O2 during the initial logic high phase of clocks CLK1, CLK2 during time 131.

Note also that the circuitry 120 that resides "above" transistors Q1 through Q4 in FIG. 1 is "off" in that no current flows through any of the four current path legs observed therein (a first current leg runs through transistors Q14, Q5, Q6, Q15; a second current leg runs through transistors Q11 and Q10; a third current leg runs through transistors Q13, Q7, Q8, Q16; a fourth current leg runs through transistors Q12 and Q9). Here, with clk1 and clk2 being high (and /clk1 and /clk2 being low), transistors Q5 through Q8 are "off". Additionally, with nodes 105 and 106 being high, transistors Q11 and Q12 are "off". As will be made more clear in the following discussion, transistors Q5 through Q8 and transistors Q11 through Q16 form redundant feedback to internal state nodes 105 and 106.

At time 132, both clocks CLK1, CLK2 transition to a logic low which turns switches 103, 104 "off" but also turns transistors Q5 through Q8 "on". The logical high level on internal nodes 105, 106 turns NMOS transistors Q9 and Q10 "on" and turns PMOS transistors Q11 and Q12 "off". With NMOS transistors Q9 and Q10 being "on", internal nodes 107, 108 are pulled to a logic low which places PMOS transistors Q13 and Q14 in an "on" state and places NMOS transistors Q15 and Q16 in an "off" state. Thus, no current is substantially flowing through any of the four current path legs because at least one transistor in each leg is in the "off" state.

From this circuit state, if a soft error is to occur on one of internal nodes 105, 106 the circuit acts to protect the original, correct data at outputs O1 and O2. For instance, if internal node 106 were to transition to a logical low level either from a direct particle hit or through an inadvertent glitch on the CLK1 signal that causes a logical low level to pass through switch 103, transistor Q1 will transition to an "on" state and transistor Q4 will transition to an "off" state.

As such, transistors Q1 and Q2 will be "on" and transistors Q3 and Q4 will be "off". With respect to the turning on of transistor Q1, output node O1 will not instantaneously rise from a logical low to a logic high. Here, because internal node 105 did not suffer a soft error and remains at a logic high level, transistor Q2 remains "on" keeping output O1, at least initially, to a logic low. The turning on of transistor Q1 might, however, tend to pull output O1 up to a higher voltage level over time if not otherwise corrected for (a temporary short-circuit current is also created between transistors Q1 and Q2). The corrective action of the latch circuit, as described in more detail further below, substantially eliminates a rise in voltage level at output O1 from occurring.

Similarly, the turning off of NMOS transistor Q4 causes output node O2 to technically "float" as both transistors Q3 and Q4 are "off". However, the absence of any immediate current path from output node O2 causes output node O2 to substantially hold its logic low voltage level until the corrective action of the latch circuit causes output O2 to more definitely hold its logic low state.

With internal node 106 being set low due to the soft error, NMOS transistor Q9 will turn "off" and PMOS transistor Q11 will turn "on". The turning "on" of PMOS transistor Q11 will cause a substantial current to flow through its current leg. The corresponding current drive through transistor Q10 keeps node 107 low.

Additionally, with transistor Q9 now being "off" and transistors Q12 and Q16 originally being off, internal node 108 has no active current path and holds its original low voltage. As such PMOS transistor Q14 remains "on". With CLK1 being low, transistors Q5 and Q6 are also "on". With transistor Q15 being "off" and transistors Q14 and Q5 being "on", the active mode Q14 and Q5 transistors, which form a leg tied to the supply voltage, will have the effect of pulling internal node 106 up to a logic high voltage level thereby counteracting the soft error.

Here, to the extent the soft error might momentarily turn transistor Q1 "on", the cause of the soft error, which is transitory, has to "fight" against the pull-up activity of "on" transistors Q14 and Q5. With transistors Q14 and Q5 being fixed in the "on" state, the temporary soft error essentially fails to permanently set node 106 to a voltage low. The reactant rise of the voltage on internal node 106 keeps transistor Q1 "off" and keeps transistor Q4 "on" which causes outputs O1 and O2 to keep their original logic low state.

Analogous operation for the case where node 105 suffers a soft error that causes the voltage on node 105 to drop to a logic low. Here, transistors Q7, Q8 and Q13 will be "on" and transistor Q16 will be "off" which will cause node 105 to be pulled back up to a logic high to counteract the soft error.

In the case where a logical "1" is latched into the circuit and a soft error causes either of internal nodes 105, 106 to rise from their proper logic low level to a high level voltage. In this case, the circuit will counteract the soft error to pull the node that suffered the error back to a low level thereby keeping a logical high at outputs O1 and O2. For example, if node 106 suffers a soft error that raises its voltage level to a logic high, transistors Q6 and Q15 will be "on" and Q14 will be "off" which will have the effect of pulling node 106 back to ground.

Additionally, the circuit will automatically counter-balance a direct internal strike to either of nodes 107 and 108. For example, consider a steady state where nodes 107 and 108 are low and node 108 receives a strike that raises node 108 high. In the steady state where node 108 is low, transistor Q12 is off and transistor Q9 is on. Because the state of these two transistors are not impacted by the strike, node 108 will be immediately pulled low again.

As described above, the circuitry naturally balances itself to keep nodes 105,106 to a same value and nodes 107,108 to a same value. This same property also protects the circuit against external errors to one of the clock lines. For instance, if a glitch occurs on one of the clock lines within time period 131 well before the transition between times 131 and 132, correct data will eventually be latched in and the circuit itself will naturally drive itself to the holding the correct data. Contra-wise, if a clock glitch occurs approximately at the transition between times 131 and 132, correct data will have already been already latched into the circuit by the time of the glitch and the circuit will naturally hold onto the correct data. Finally if a clock glitch occurs in time 132 and a new data value is inadvertently passed through one of the switches 103/104, the circuit will naturally suppress the error and drive itself to the correct internal state that existed before the glitch.

Note also that the ability of the circuit to keep correct data is enhanced by the existence of redundant clock lines. For instance, if a glitch occurs to the clk1 signal during time 131, transistors Q5 and Q6 will be inadvertently turned off. However, nodes 105 through 108 will keep their state with the assistance of transistors Q7 and Q8 remaining on and being driven by the other, non glitched clock clk2.

Figure 2A:
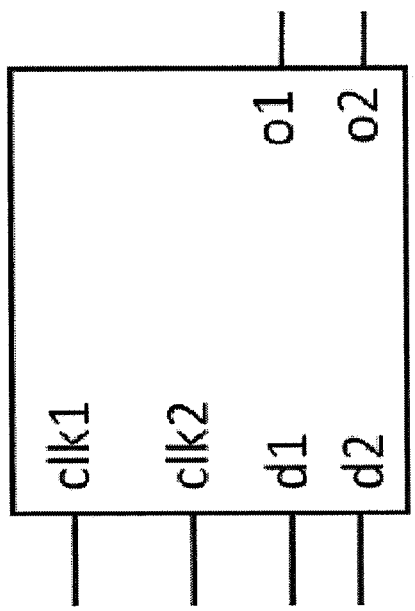
FIG. 2a shows a high level depiction of the latch circuit of FIG. 1.

FIG. 2a shows a higher level depiction 200 of the latch circuit of FIG. 1. As with the latch circuit 100 of FIG. 1, the latch circuit 200 of FIG. 2a has redundant data inputs d1, d2, redundant clock inputs clk1, clk2 and redundant data outputs O1, O2. Also as discussed above with respect to FIG. 1, the latch circuit 200 of FIG. 2a ideally latches same data presented on both of the d1 and d2 data inputs according to a particular logic level on both of clock inputs clk1, clk2. If the latch circuit suffers a soft error internally, or if "bad data" is inadvertently latched into the circuit because of a glitch on one of the clock inputs or one of the data inputs, the latch circuit 200 automatically counteracts the error and keeps correct data at outputs O1 and O2.

Figure 2B:
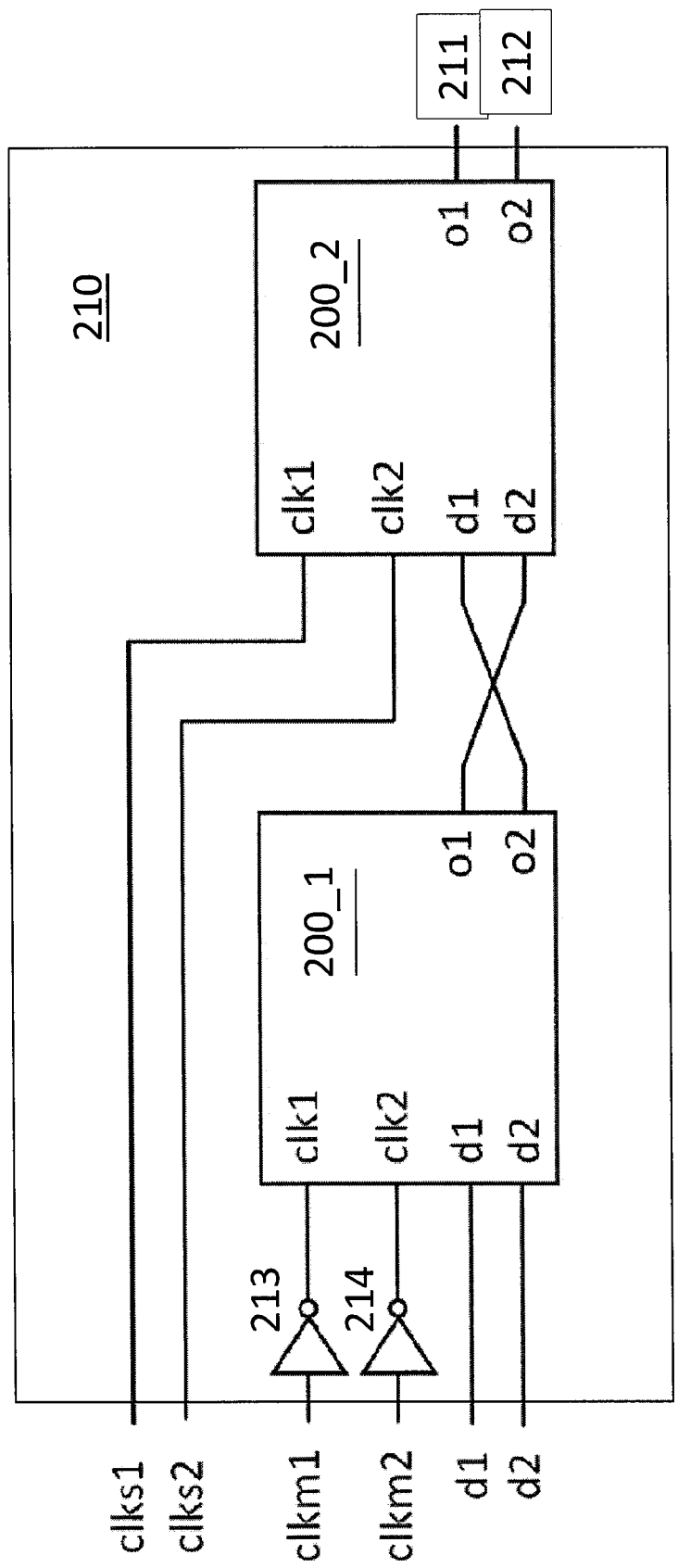

FIG. 2b shows a master-slave flip-flop 210 constructed from a pair of the latch circuits 200_1, 200_2 of FIG. 2a. The first latch 200_1 may be referred to as the master latch and the second latch 200_2 may be referred to as the slave latch. Consistent with the traditional operation of a master-slave flip-flop, data can be made to appear at the slave outputs 211, 212 upon a clock edge rather than a clock logic low or logic high level. However, unlike a traditional master-slave flip-flop, the master-slave flip-flop 210 of FIG. 2b uses redundant data paths and redundant clock signals to internally reject soft errors.

In an embodiment where both latch circuits 200_1, 200_2 are implemented with the design 100 of FIG. 1, when the master clock signals (clkm1, clkm2) are a logic low, the front end inverters 213, 214 invert the clock signals to present a logic high at both of the clk1, clk2 inputs of latch 200_1 thereby latching the data on the data inputs d1, d2 into the master latch circuit 200_1. The values of d1, d2 should immediately appear at the O1, O2 outputs of the first latch 200_1 after a propagation delay through the first latch 200_1.

When the logic level of the slave clocks (clks1, clks2) rises to a logic high, the data values that are presented at the O1, O2 outputs of the first latch 200_1 will be latched into the second latch 200_2 and will appear at the flip-flop outputs 211, 212 after a propagation delay through the second latch 200_2. If the master and slave clocks are tied together to form a redundant same clock signal (e.g., clkm1 is tied to clks1 and clkm2 is tied to clks2), data in the master is latched when the clock transitions from low to high and the slave 202_2 becomes transparent (O1 and O2 of the master 200_1 flow through to outputs 211 and 212).

Figure 2C:
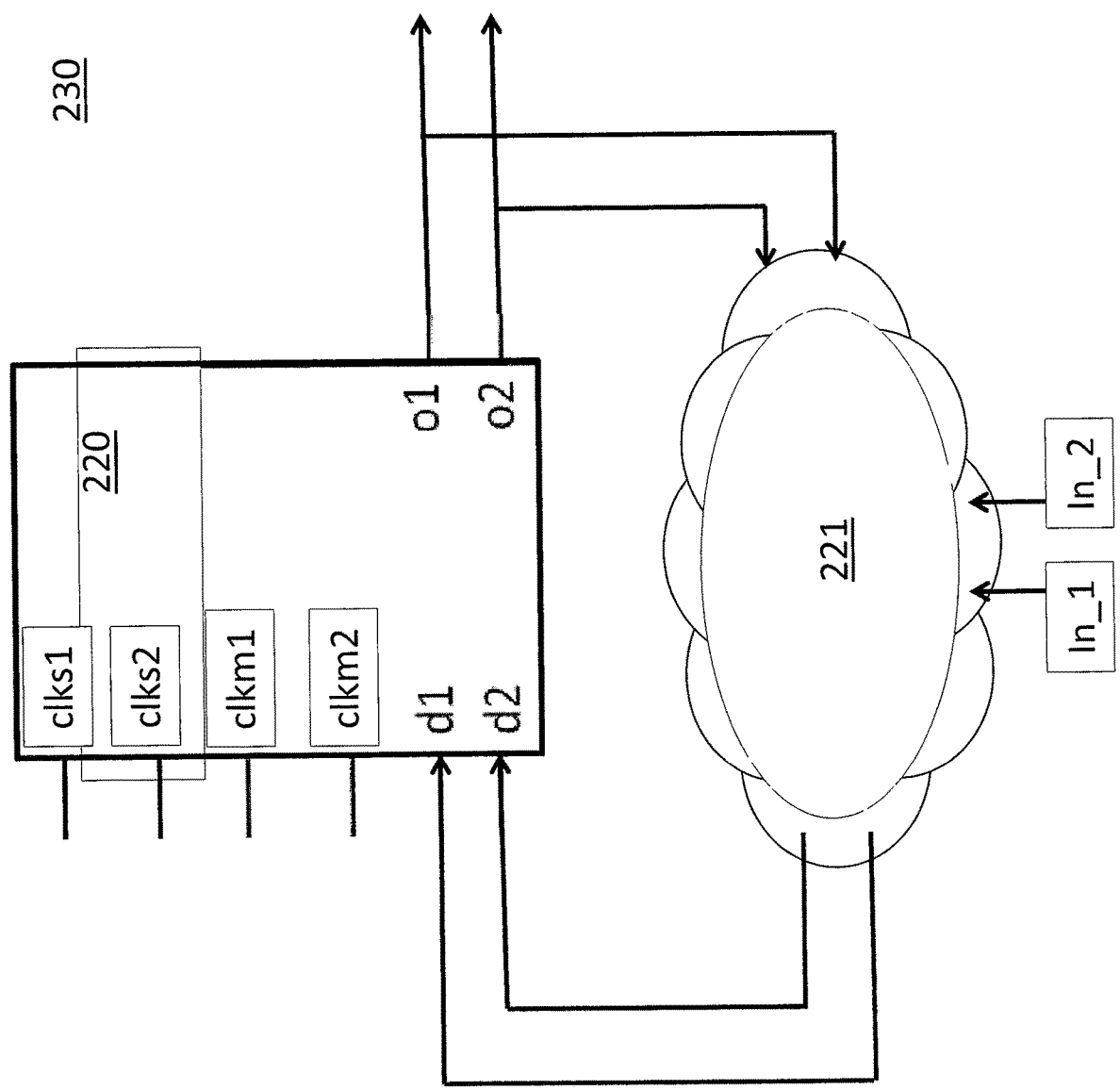
FIG. 2c shows a finite state machine constructed from the flip-flop circuit of FIG. 2b.

FIG. 2c shows a higher level depiction 220 of the master slave flip-flop of FIG. 2b configured in a finite state machine arrangement 230. A finite state machine includes a state holding element 220 having a feedback path through combinatorial logic 221 between the state holding element's output and its input. General inputs to the finite state machine, e.g., In_1, In_2, can be provided directly to the combinatorial logic 221 as well. Here, the master slave flip-flop of FIG. 2b corresponds to the state holding element 220 and combinatorial logic 221 of the state machine 230.

A next input to the state holding element 220 is a function of the generic inputs In_1, In_2 and/or the current state of the state holding element 220 as submitted to the combinatorial logic 221. Here, for instance, if the master and slave clocks are tied together, input values received at the d1, d2 inputs of the flip-flop 220 from the combinatorial logic 221 can be entered into the device, e.g., when the clock signal is low and will appear at the flip-flop's outputs O1, O2 in response to the clock rising to a logic high. The state machine of FIG. 2c is believed to be unique as a consequence of its redundant clock, internal data and output values and its natural immunity to soft errors.

Figure 3:
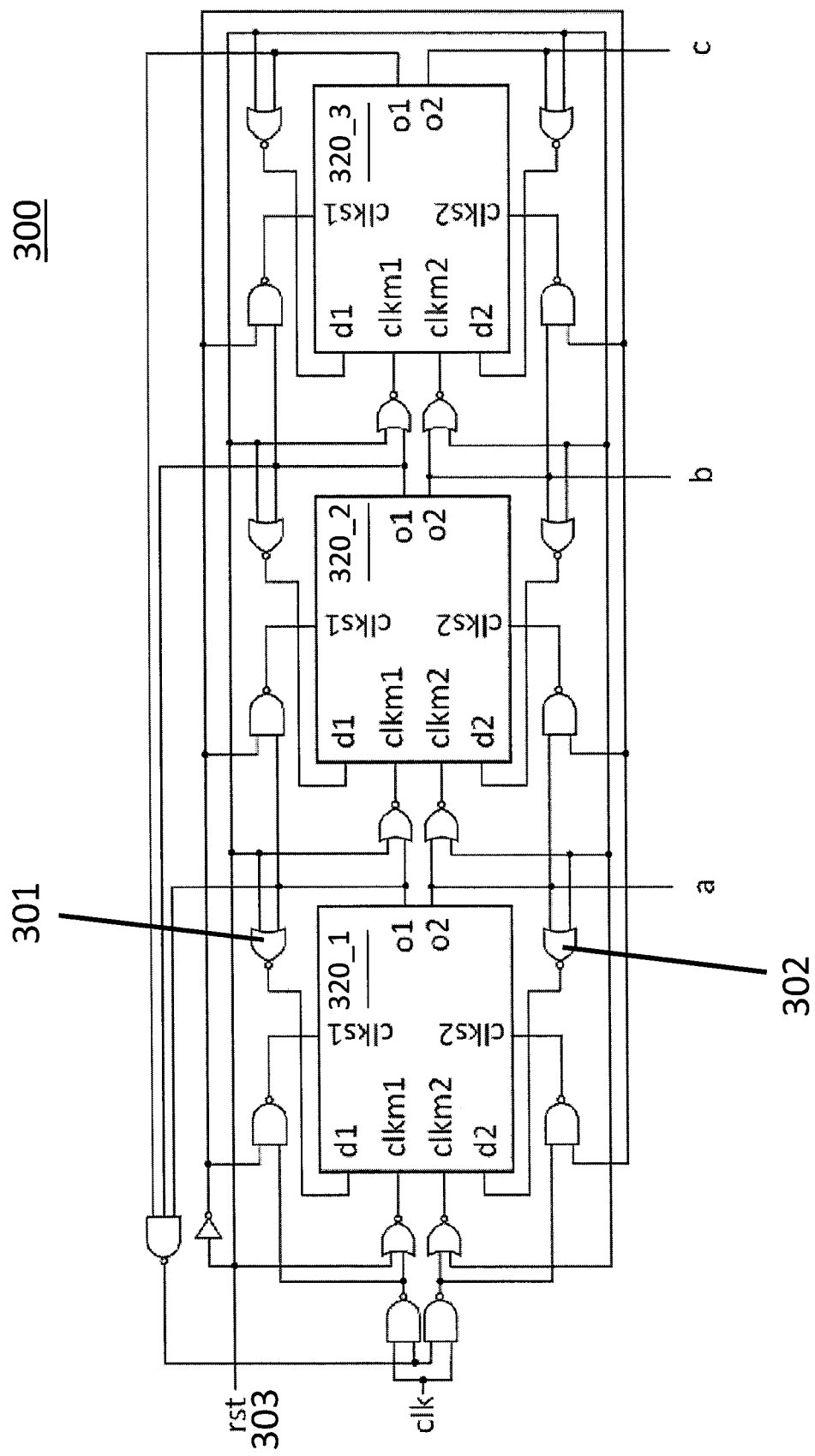
FIG. 3 shows an embodiment of a counter circuit constructed from state machines like that of FIG. 2c.

As is known in the art, state machines are used to implement various different kinds of circuits such as counters, adders, multipliers, custom functions, etc. FIG. 3 shows a three bit counter circuit 300 constructed from three finite state machine circuits that each conform to the general state machine depiction of FIG. 2c.

Here, each of the flip-flop circuits 320_1, 320_2, 320_3 of FIG. 3 are observed to have a feedback path stemming from its output to its input through combinatorial logic and therefore conforms to the state machine model of FIG. 2c. For instance, the O1 output of flip-flop 320_1 is coupled to the d1 input of flip-flop 320_1 through NOR gate 301 and the O2 output of flip-flop 320_1 is coupled to the d2 input of flip-flop 320_1 through NOR gate 302. The other flip-flops 320_2, 320_3 are similarly configured. As such, the three bit counter of FIG. 3 is implemented with three separate state machine circuits, where each state machine circuit includes one of the flip-flops as its state holding element and the NOR gates between its O1, O2 outputs and its d1, d2 inputs correspond to its combinatorial logic.

A counter circuit presents a count value across its state holding elements. As such, with the three flip-flops 320_1, 320_2, 320_3 of FIG. 3 corresponding to the state holding elements of the counter, the count value of the counter is recognized as (c,b,a) where "c" is the most significant bit provided from flip-flop 320_3 and "a" is the least significant bit provided from flip-flop 320_1. Ideally, the counter increments with each next clock cycle.

After a logic high reset signal is applied to the circuit as the reset input 303, a value of 0 will be presented at the d1 and d2 inputs of all three flip-flops, a value of 0 will be presented at the clkm1 and clkm2 inputs of all three flip-flops and a value of 1 will be presented at the clks1 and clks2 inputs of all three flip flops. As such, a (c,b,a) value of 000 will be latched into the counter 300. After the reset value is dropped to a logic low, the counter will begin counting on a next clock cycle.

Here, with an initial (c,b,a) value of 000, a value of 1 will be present at both d1 and d2 inputs of all three first flip-flops. As will become more apparent in the immediately following discussion, each time a flip-flop transitions to an output value of 0, its immediately downstream flip-flop will transition to an output value of 1 (flip-flop 320_2 is downstream from flip-flop 320_1 and flip-flop 320_3 is downstream from flip-flop 320_2).

Upon the first clock cycle following the release of the reset, when the input clock signal clk is low, a value 0 will be present at the clkm1 and clkm2 inputs of the first flip flop 320_1 and a value of 1 will be present at the clks1 and clks2 inputs of the first flip flop 320_1. As such, the first flop 320_1 will transition from an output value of 0 to an output value of 1 at both its O1 and O2 outputs and the (c,b,a) output value of the counter will transition from an output of 000 to an output of 001. Also, with the transition of the output value of the first flop-flop 320_1 to a value of 1 at its O1 and O2 outputs, the clkm1 and clkm2 inputs to the second flip-flop 320_2 will fall to a logic low which latches a value of 1 into the second flip-flop 320_2. However, the output value of the second flip-flop 320_1 will not transition because its clks1 and clks2 inputs are set to a value of 0 with the first-flop's O1, O2 output values being set to a 1.

Upon the second clock cycle, when the input clock signal clk is low, a value 0 will be present at the clkm1 and clkm2 inputs of the first flip flop 320_1 and a value of 1 will be present at the clks1 and clks2 inputs of the first flip flop 320_1. The value of the d1 and d2 inputs of the first flop-flops 320_1 are at 0 owing to the output value of 1 at the O1, O2 outputs of the first flip-flop 320_1. As such, the first flop 320_1 will transition from an output value of 1 to an output value of 0 at its O1 and O2 outputs. This transition will also cause the clks1 and clks2 clock inputs of the second flip-flop 320_2 to rise to a logic high which will cause the previously internally latched value of 1 within the second flip-flop 320_2 to be presented at the O1 and O2 outputs of the second flip-flop 320_2. As such, the (c,b,a) output value of the counter will have transitioned to an output value of 010.

Upon the third clock cycle, the O1 and O2 output values of the first flip-flop 320_1 will transition to a value of 1 owing to the same process described above when the circuit first came out of reset. A value of 0 will be latched internally at both the d1 and d2 inputs of the second flip-flop 320_2 but the value will not be presented at the second flip-flop 320_2 output because the clks1 and clks2 inputs of the second flip-flop 320_2 will be set at a value of 0. As such, the (c,b,a) output value of the counter will correspond to a count value of 011.

Upon the fourth clock cycle, the O1 and O2 output values of the first flip-flop 320_1 will transition to a value of 0 according to the process described above for the second clock cycle. In response to the transition, the O1 and O2 output values of the second flip-flop 320_2 will also transition to a value of 0. Additionally, the O1 and O2 output values of the third flip-flop 320_3 circuit will transition to a value of 1. As such, the (c,b,a) output value of the counter will correspond to a value of 100. The O1 and O2 output values of the third flip-flop 320_3 will not transition back to a 0 until the next sequence at which the O1 and O2 output values of both the first and second flip-flops 320_1, 320_2 are set to a value of 1.

With the flip-flops being designed to internally suppress a soft error, if a soft error occurs within any of the flip-flops, the error will not present itself at the (c,b,a) output of the counter thereby preventing corruption of the count value. Also, owing to the soft error suppression capability of the latch circuits within the flip-flops, it is pertinent to recognize that if a soft error occurs on any of the data lines that feed a flip-flop, the flip-flop will not respond if one data input (e.g., d1) is a first logic value (e.g., a 0) and the other data input (e.g., d2) is a second logic value (e.g., a 1). Here, the analysis will be akin to the discussion of FIG. 1 in which it was shown that if one of nodes 105 or 106 flips the circuit will return to its original state where both of nodes 105 and 106 were equal.

Figure 4:
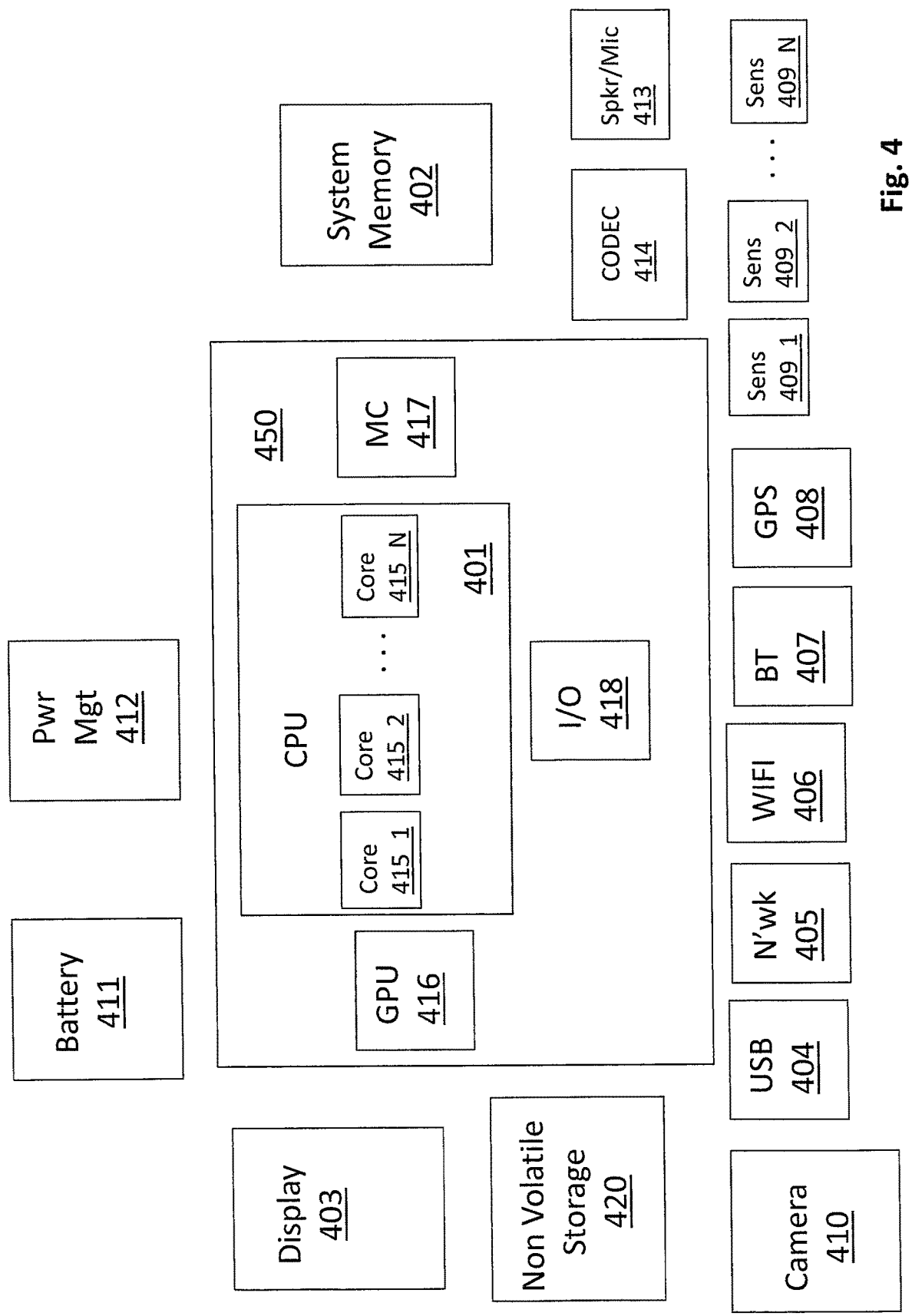
FIG. 4 shows a computing system.

FIG. 4 shows a depiction of an exemplary computing system 400 such as a personal computing system (e.g., desktop or laptop) or a mobile or handheld computing system such as a tablet device or smartphone.

As observed in FIG. 4, the basic computing system may include a central processing unit 401 (which may include, e.g., a plurality of general purpose processing cores and a main memory controller disposed on an applications processor or multi-core processor), system memory 402, a display 403 (e.g., touchscreen, flat-panel), a local wired point-to-point link (e.g., USB) interface 404, various network I/O functions 405 (such as an Ethernet interface and/or cellular modem subsystem), a wireless local area network (e.g., WiFi) interface 406, a wireless point-to-point link (e.g., Bluetooth) interface 407 and a Global Positioning System interface 408, various sensors 409_1 through 409_N (e.g., one or more of a gyroscope, an accelerometer, a magnetometer, a temperature sensor, a pressure sensor, a humidity sensor, etc.), a camera 410, a battery 411, a power management control unit 412, a speaker and microphone 413 and an audio coder/decoder 414.

An applications processor or multi-core processor 450 may include one or more general purpose processing cores 415 within its CPU 401, one or more graphical processing units 416, a memory management function 417 (e.g., a memory controller) and an I/O control function 418. The general purpose processing cores 415 typically execute the operating system and application software of the computing system. The graphics processing units 416 typically execute graphics intensive functions to, e.g., generate graphics information that is presented on the display 403. The memory control function 417 interfaces with the system memory 402. The power management control unit 412 generally controls the power consumption of the system 400. The system memory 402 may be a multi-level system memory having, e.g., a faster higher level and a slower lower level.

Each of the touchscreen display 403, the communication interfaces 404-407, the GPS interface 408, the sensors 409, the camera 410, and the speaker/microphone codec 413, 414 all can be viewed as various forms of I/O (input and/or output) relative to the overall computing system including, where appropriate, an integrated peripheral device as well (e.g., the camera 410). Depending on implementation, various ones of these I/O components may be integrated on the applications processor/multi-core processor 450 or may be located off the die or outside the package of the applications processor/multi-core processor 450.

Any of the circuitry of the computing system may make use of a latch circuit and any associated state machine circuitry that uses a latch structure having internal suppression of soft errors.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
   a latch circuit comprising a), b), c) and d) below:
   a) redundant data inputs;
   b) redundant data outputs respectively coupled to a first output driver and a second output driver;
   c) redundant clock inputs;
   d) circuitry to self-correct a soft-error comprising a first internal node and a second internal node, the first internal node coupled to one input of the redundant data inputs, first opposite polarity transistors of the first and second output drivers and a gate node of a first transistor, the first transistor coupled in series with a second transistor to form a first current leg between power and reference nodes, the second internal node coupled to another input of the redundant data inputs, second opposite polarity transistors of the first and second output drivers that are different than the first opposite polarity transistors, and a gate node of a third transistor, the third transistor coupled in series with a fourth transistor to form a second current leg between the power and the reference nodes.

2. The apparatus of claim 1 wherein the circuitry to self-correct a soft error further comprises the first internal node coupled to a gate node of the fourth transistor, the second internal node coupled to a gate node of the second transistor.

3. The apparatus of claim 1 wherein the circuitry to self-correct a soft-error further comprises a third current leg and a fourth current leg coupled between the power and reference nodes, the first internal node coupled between opposite polarity transistors of the third current leg, the second internal node coupled between opposite polarity transistors of the fourth current leg.

4. The apparatus of claim 1 wherein the latch circuit comprises a first switch downstream from a first clock input of the redundant clock inputs and a second switch downstream from a second clock input of the redundant clock inputs.

5. The apparatus of claim 1 wherein the circuitry to self-correct a soft-error further comprises a first node and a second node, the first node being a different node than the first internal node, the second node being a different node than the second internal node, and the circuitry to correct the soft-error is designed to settle the first and second nodes at a same logic level.

6. The apparatus of claim 1 wherein the latch circuit is coupled to another latch circuit having its own respective set of redundant data inputs, data outputs and clock inputs.

7. The apparatus of claim 6 wherein the latch circuit and the another latch circuit form a flip-flop.

8. The apparatus of claim 1 wherein the latch circuit is within a computer system, the computer system comprising a network interface.

* * * * *